United States Patent [19]

Mita et al.

[11] Patent Number: 5,313,248

[45] Date of Patent: May 17, 1994

[54] HEAT PROTECTION OF PHOTOSENSITIVE ELEMENTS IN IMAGE FORMATION APPARATUS

[75] Inventors: Yasuhiro Mita; Atsushi Kobayashi; Nobumasa Abe; Takashi Suzuki; Kazutoshi Fujisawa; Eiji Kumai; Saburo Furukawa, all of Suwa, Japan

[73] Assignee: Seiko Epson Corporation, Tokyo, Japan

[21] Appl. No.: 809,560

[22] PCT Filed: May 23, 1991

[86] PCT No.: PCT/JP91/00685

§ 371 Date: Mar. 11, 1991

§ 102(e) Date: Mar. 11, 1991

[87] PCT Pub. No.: WO91/18328

PCT Pub. Date: Nov. 28, 1991

[30] Foreign Application Priority Data

May 24, 1990 [JP] Japan ................................ 2-134662
Jun. 18, 1990 [JP] Japan ................................ 2-159422
Feb. 19, 1991 [JP] Japan ................................ 3-024936
Feb. 20, 1991 [JP] Japan ................................ 3-026027

[51] Int. Cl.⁵ ........................ G03B 27/32; G03B 27/52
[52] U.S. Cl. .................................................... 355/27
[58] Field of Search ...................... 355/27, 28, 99, 100, 355/106

[56] References Cited

U.S. PATENT DOCUMENTS

| | | | |
|---|---|---|---|
| 3,684,372 | 8/1972 | Limberger | 355/27 X |
| 4,624,558 | 11/1986 | Johnson | 355/28 X |
| 4,626,099 | 12/1986 | Zuelke et al. | 355/99 |
| 4,653,890 | 3/1987 | Nordstrom et al. | 355/27 X |
| 4,697,919 | 10/1987 | Hertel | 355/27 |
| 4,860,058 | 8/1989 | Kobayashi et al. | 355/27 |
| 4,918,482 | 4/1990 | Ogura | 355/27 |
| 5,070,359 | 12/1991 | Nagata et al. | 355/27 |

FOREIGN PATENT DOCUMENTS 1186926 7/1989 Japan.
216551 1/1990 Japan.
290159 3/1990 Japan.

Primary Examiner—Fred L. Braun
Attorney, Agent, or Firm—Eric B. Janofsky

[57] ABSTRACT

An image formation apparatus is provided having a continuous form photosensitive member positioned to move along a pre-defined transfer path. An image is exposed on to a portion of the photosensitive member along the transfer path. A heat developer heats the exposed image portion and intercepts the heat to an unexposed portion of the photosensitive member. The heat developer has a cylindrical housing having a heated portion arranged along a longitudinal axis of the cylindrical housing and a heating element in surface contact with and for heating exposed portions of the photosensitive member. The cylindrical housing also has an unheated portion arranged along the longitudinal axis of the cylindrical housing and separated from the heated portion by a thermally insulative material. A thermal shield is selectively movable along the transfer path in synchronism with and in the direction of transfer of the photosensitive member between a heat shielding position and a non-heat shielding position for protecting and preserving unexposed portions of the photosensitive member. The thermal shield has a curved heat shield position adjacent to the heating element and movable concentrically about the longitudinal axis between the heat shielding position between the heating element and photosensitive member and the non-heat shield position.

17 Claims, 15 Drawing Sheets

HEAT PROTECTION OF PHOTOSENSITIVE ELEMENTS IN IMAGE FORMATION APPARATUS

BACKGROUND OF THE INVENTION

1. Technical Field

The present invention relates to an image formation apparatus such as a copying machine, a printer or the like, utilizing a photosensitive transfer type heat development material to form output images. More particularly, it relates to a heat developing machine portion of an image formation apparatus and a method of transferring a photosensitive member.

2. Background Art

Various methods and apparatus for forming images have been known. A conventional image formation apparatus utilizing a heat development material of the photosensitive transfer type is disclosed in, for example, Japanese Laid-Open Patent Publication No. 62-147461. According to this publication, main mechanism portions, such as an exposure portion, a heat development portion, and a pressure transfer portion, are arranged within one region of the apparatus. Image formation is performed according to the following procedure.

First, a roll-like heat development material of the photosensitive transfer type is cut into predetermined lengths before being exposed to an image to form a latent image. Next, heat rollers heat-develop the image. Then, the photosensitive member is superposed by image-receiving paper, and transferred under pressure by rollers. The photosensitive member is discharged by a separation device to a disposal portion therefor, whereas the image-receiving paper is discharged to a tray through a fixing device.

The above conventional art, however, has the following problems.

First, a used photosensitive member which is no longer usable by the apparatus operator is discharged each time an image is formed. The operator must provide a new photosensitive member when the existing photosensitive member is no longer usable, and besides, must also dispose of the used photosensitive member, thus, doubling the operator's work.

Second, a mechanism is required to cut the roll-like photosensitive member. Such a mechanism affects the tension and loading on the photosensitive member considerably, thus creating problems such that the photosensitive member is carried in an unsmooth manner, raised or wrinkled. In the conventional art, because this mechanism is near the exposure portion, such problems become particularly serious. For this reason, there is a demand for a more accurate and complex carrying mechanism in photosensitive member carrying portions, including the exposure portion.

Third, because the photosensitive member and the image-receiving paper in the form of cut sheets are superposed on each other to be transferred under high pressure, an accurate mechanism or device to separate the photosensitive member and paper with certainty is required.

These problems can be solved if the photosensitive member is not cut into sheets but has a continuous form. However, since the path along which the photosensitive member area is carried after exposure is long, the amount of useless photosensitive member increases enormously, resulting in an increase in the cost of the photosensitive member. For this reason, it is possible to effectively make better use of the photosensitive member by rewinding it. However, the unused photosensitive member has passed through a heat developing device, thereby being affected by the heat. Therefore, the photosensitive member is no longer reusable, and thus the portion of useless photosensitive member increases or remains high.

Fourth, while the photosensitive member is being carried through the image apparatus, fine dust particles and the like in the carrying mechanism damage an image forming micro capsule disposed on the member, markedly deteriorating the quality of any output image.

Because of the rapidly increasing trend toward OA, the use of various kinds of electronic equipment has recently spread among many people of varying skill levels. When consumers are going to use electronic equipment, it is very important to consider several factors, such as ease of replacement parts, ease of understanding the structure and operation, and cost (running cost), so that it can be used by the consumer without hesitation.

SUMMARY OF THE INVENTION

The present invention solves the problems mentioned above. An object of the invention is, therefore, to provide an easy to handle image formation apparatus which has a simple photosensitive member carrying/separating mechanism, but does not have a mechanism for cutting the photosensitive member, so that the member can be used more effectively. The image formation apparatus has improved reliably, and generally causes the user few problems.

Another object of the invention is to provide an image formation apparatus which prevents an unexposed portion of a continuous form photosensitive member from being subjected to a heat phenomenon, so that the photosensitive member is hardly affected by heat, and which can record clear and high-quality images.

A further object of the invention is to provide a safe heat developing device having high energy efficiency because the photosensitive member is not in contact with a heating element of the heat developing device when it is on standby.

The present invention provides an image formation apparatus characterized by comprising a photosensitive member in a continuous form having on a supporting body a micro capsule in which at least a photosensitive substance and a coloring material are sealed, exposure devices for exposing an image onto the photosensitive member, a heat developing device having means for heating an image exposure portion of the photosensitive member and means for intercepting heat to an unexposed portion of the photosensitive member, and a pressure transfer device for superposing, under pressure, the photosensitive member and a transfer member together. The heat developing device is characterized by having a movably-constructed thermal shield member, a thermal shield mechanism operable synchronously with the transfer of the unexposed portion of the photosensitive member, or a mechanism for changing the path along which the photosensitive member is carried.

The heat developing device can be switched from a heated state to a non-heated state and vice versa; the pressure transfer device can be switched from a pressurized state to a non-pressurized state and vice versa; and the carrying device can change the direction in which the photosensitive member is carried. During image formation, the heat developing device is in the heated state; the pressure transfer device is in the pressurized state; and the photosensitive member is carried in a forward direction. At the completion of image formation, the heat developing device is in the non-heated state; the pressure transfer device is in the non-pressurized state; and the photo sensitive member is carried in a reverse direction.

Thus, according to this invention, an image formation apparatus utilizing heat development of photosensitive transfer type material exhibits the following advantages.

First, during and at the completion of image formation, the states of the heat developing and pressure transfer devices are switched to change the direction in which the photosensitive member is carried. A simple carrying system greatly improves the reliability of the apparatus. The photosensitive member can be rewound, thereby making it reusable. A simple carrying/separating mechanism can be constructed which does not have a mechanism for cutting the photosensitive member. It is possible to effectively use the photosensitive member and reduce the apparatus user's trouble.

Also, the photosensitive member is carried, during image formation, by a pressure transfer portion, or after pressure transfer, so that it is not damaged before being transferred. It is thus possible to always obtain good quality output images.

Second, a photosensitive member with an exposed image is fully heated and heat-developed, whereas heat is immediately intercepted for an unexposed photosensitive member so that it is minimally affected by heat. Therefore, clear and high-quality images can be recorded. Such an advantage is enhanced by providing a thermal shield mechanism having a movable thermal shield member disposed between the carrying path of the photosensitive member and a heat portion. The thermal shield mechanism operates synchronously with the transfer of the unexposed portion of the photosensitive member.

Third, the unexposed portion of the photosensitive member will not be heat-developed more than necessary, nor will a portion of the photosensitive member remain heated long when it, is on standby. It is possible to safely operate the apparatus, which eliminates problems such as the photosensitive member being melted.

Other objects and attainments together with a fuller understanding of the invention will become apparent and appreciated by referring to the following description and claims taken in conjunction with the accompanying drawings.

DESCRIPTION OF THE PREFERRED EMBODIMENTS

The image formation apparatus of the present invention will be described below in detail in accordance with the embodiments.

Figure 1:
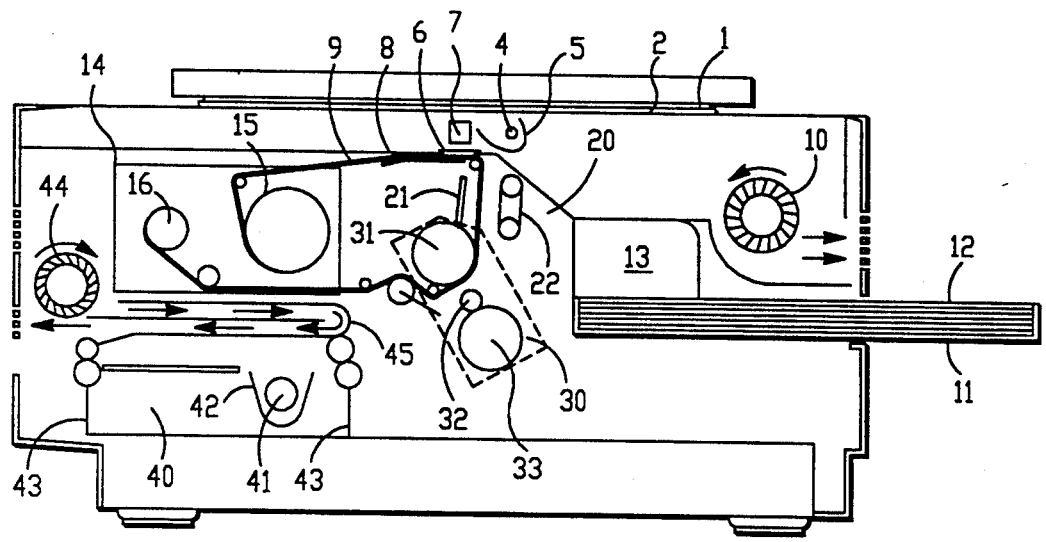
FIG. 1 is a cross-sectional view showing a first embodiment of the present invention.

FIG. 1 is a front cross-sectional view of a copying or image formation machine showing a first embodiment of this invention. The structure of this first embodiment will be explained first. A manuscript 1 is retained between a manuscript mount 2 and a manuscript cover 3. A light source 4 and a reflector 5 irradiate the manuscript 1. At the time of exposure, a shutter 6 is released, and a lens 7 forms an image from the manuscript 1 onto a photosensitive member 9 on an exposure mount 8. The photosensitive member 9 is housed in a cassette 14, and an unused photosensitive member portion is fed from a supply roll 15, whereas a used photosensitive member portion is withdrawn around a wind-up roll 16. An exhaust fan 10 primarily cools the light source 4. A heat developing device 20 is composed of a face-like heater 21 and a driven belt 22, and heat develops the photosensitive member 9 on which a latent image is formed. In this embodiment, although the face-like heater 21 is used as a heater for heat development, an R-shaped or a rotatable cylindrical heater may also be used. A paper feeding device 13 sends out a transfer member in the shape of a cut sheet which is accommodated in a paper feed tray 11. An upper roller 31, a middle roller 32 and a lower roller 33 in a pressure transfer device 30 put the heat-developed photosensitive member 9 and the transfer member 12 together under pressure, thus transferring an image from the photosensitive member 9 to the transfer member 12. The transfer member 12 onto which the image has been transferred is sent to a fixing device 40 and is heated by a heater 41 and a heat reflecting plate 42 so as to fix the transferred image. A shielding plate 43 prevents heat generated by the heater 41 from diffusing into the apparatus. A duct 45 and an air fan 44 serve to intercept the transmission of the heat generated by the heater 41 to the photosensitive member. The fixing device 40 contains a substance in the form of a transfer member whose properties change when it is heated. This is a mechanism required for putting a finish, such as a glossy or a transparent finish on an output image, and may not be used when the output image is limited to a non-glossy finish or the like.

The operation of various components will now be explained in the order of FIGS. 2 to 6.

Figure 2:
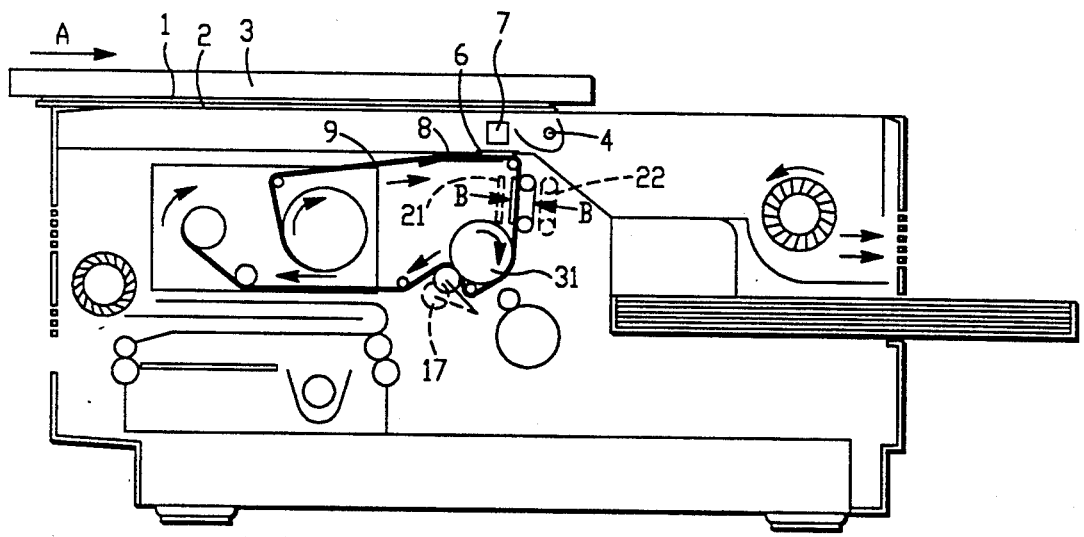
FIG. 2 is a cross-sectional view showing the states of various components when the operation of the first embodiment begins.

First, once a copy operation begins, as shown in FIG. 2, the manuscript cover 3 move to an exposure start position on the left-hand manuscript cover 3 move to an exposure start position on the left-hand side of the figure. Scanning begins in a direction indicated by arrow A. At the same time, the upper roller 31 rotates, and a pinch roller 17 is pressed against it, whereby the photosensitive member 9 is carried synchronously with the scanning of the manuscript. At this point, the light source is lit followed by the release of the shutter 6, and the latent image of the manuscript 1 is formed through the lens 7 onto the photosensitive member portion on the exposure mount 8. When the front edge of the latent image approaches the face-like heater 21, the photosensitive member 9 is sandwiched between the face-like heater 21 and the driven belt 22, as shown by arrows B and heat development begins.

Figure 3:
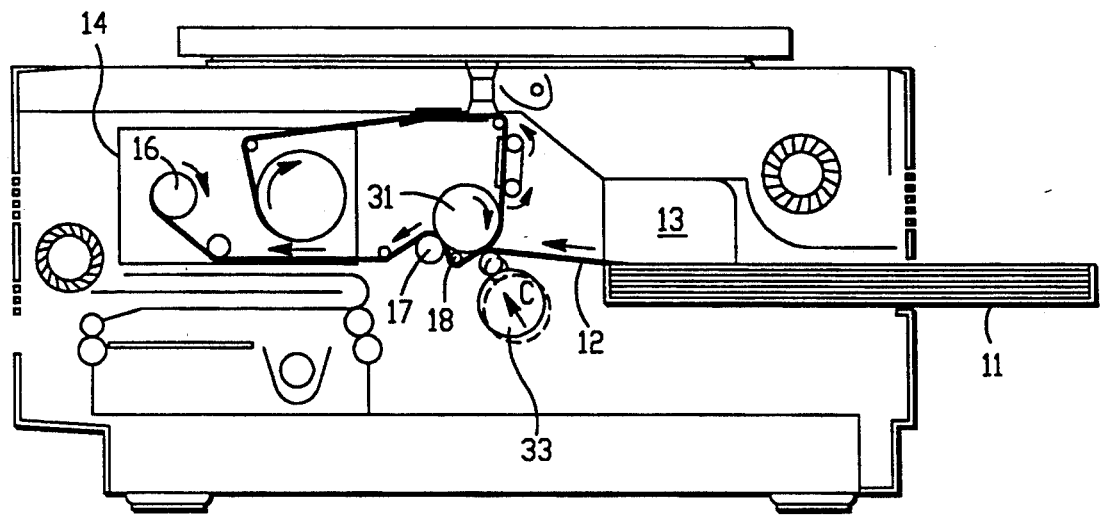
FIG. 3 is a cross-sectional view showing the states of the various components when pressure transfer is performed in the first embodiment.

Next, as shown in FIG. 3, when the front edge of the heat-developed image approaches the upper roller 31, the transfer member 12 is supplied by the paper feeding device 13 from the paper feed tray 11, and is superposed with an image zone on the photosensitive member. The middle roller 32 and the lower roller 33 move in a direction indicated by arrow C. The image and image zone are pressed by and between the upper, middle, and lower rollers. The pressure transfers the image from the photosensitive member 9 onto the transfer member 12. After this transfer, the photosensitive member 9 is separated by a separation roller 15 from the transfer member 12, and is withdrawn onto the wind-up roll 16 in the cassette 14 via the pinch roller 17.

Figure 4:
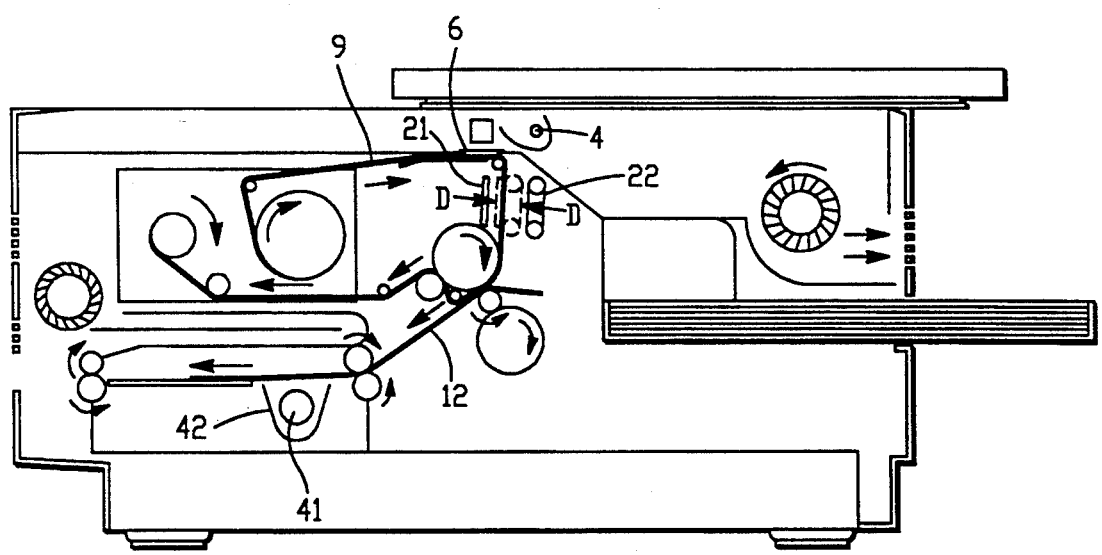
FIG. 4 is a cross-sectional view showing the states of the various components when exposure is completed in the first embodiment.

As shown in FIG. 4, the transfer member 12 onto which the image has been transferred is heated by the heater 41 and the heat reflecting plate 42 so as to fix the image.

Then, as illustrated in FIG. 4, after exposure scanning has been completed, the light source 4 goes off and the shutter 6 closes. After the back edge of the exposed image has been heat-developed, the face-like heater 21 and the driven belt 22 move in a direction indicated by arrows D so as not to develop any unused photosensitive member, which may be carried before the back edge of the image is completely transferred under pressure. At this point, if a cooling fan or the like, not shown, cools the photosensitive member 9 situated near the face-like heater 21 and the driven belt 22, the unused photosensitive member can be more effectively protected.

Figure 5:
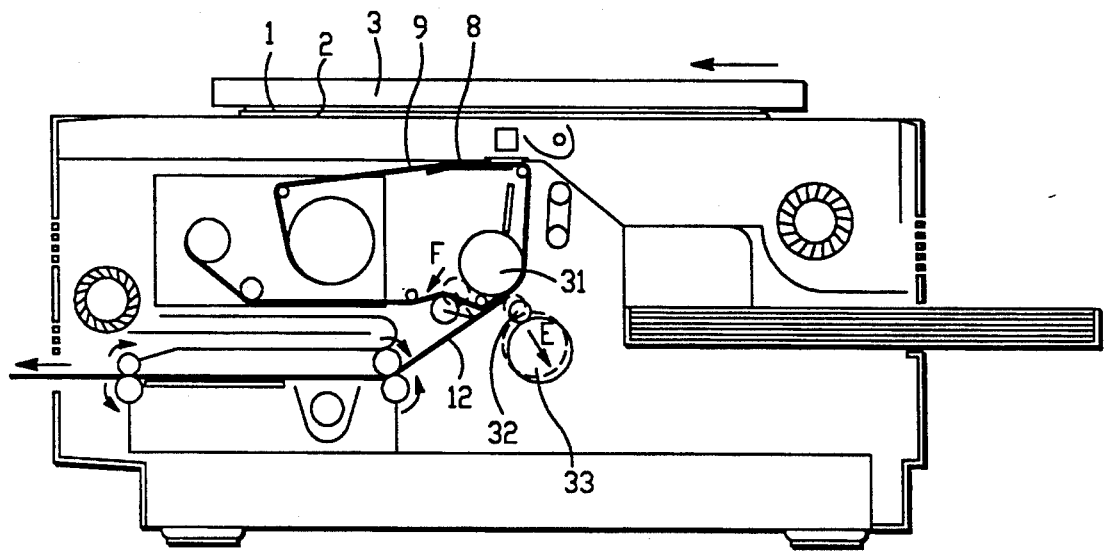
FIG. 5 is a cross-sectional view showing the states of the various components when pressure transfer is completed in the first embodiment.

Furthermore, as illustrated in FIG. 5, after the back edge of the image has been completely transferred under pressure, the middle roller 32 and the lower roller 33 move in a direction indicated by arrow E, whereas the pinch roller 17 moves in a direction indicated by arrow F and the transfer of the photosensitive member 9 stops. The transfer member 12, which has been completely transferred under pressure, is discharged outside of the apparatus while it is being heat-fixed. The manuscript mount 2, onto which the manuscript 1 is placed, and the manuscript cover 3 return to the center of the apparatus.

Figure 6:
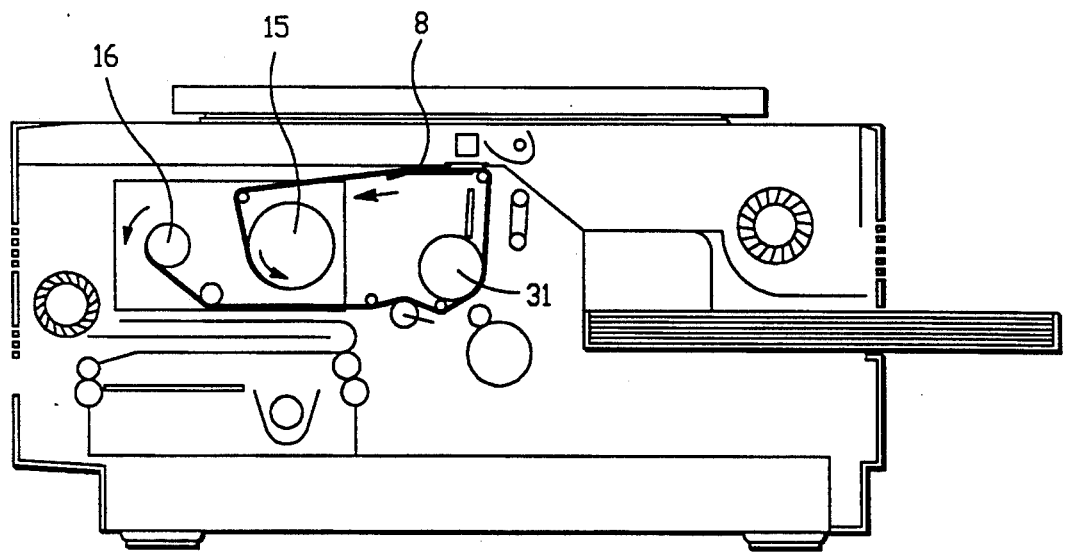
FIG. 6 is a cross-sectional view showing the states of the various components when rewinding is carried out in the first embodiment.

At this time, the unused photosensitive member is withdrawn between the exposure mount 8 and the upper roller 31. As shown in FIG. 6, the supply roll 15 is operated in a direction indicated by arrow G, thereby rewinding the end of the unused portion photosensitive member until it returns to the exposure mount 8. The amount of rewinding desired for the unused photosensitive member can be easily detected and controlled by means of any one of the rollers in a photosensitive member carrying system or by the provision of a rotary encoder connected to the supply roll 15 and the wind-up roll 16. After a series of operations have finished, the apparatus returns to the state shown in FIG. 1, completing the whole image formation operation.

Figure 7:
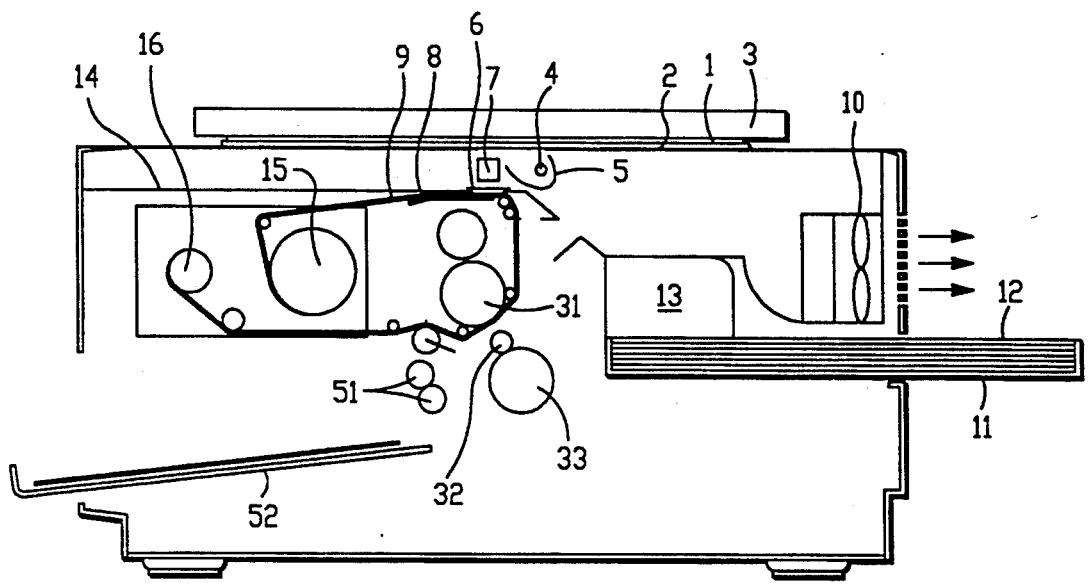
FIG. 7 is a cross-sectional view showing a second embodiment of this invention.

FIG. 7 represents a front cross-sectional view of a copying machine showing a second embodiment of this invention. In FIG. 7, manuscript 1 is retained between a manuscript mount 2 and a manuscript cover 3. A light source 4 and a reflector 5 irradiate the manuscript 1. At the time of exposure, a shutter 6 is released, and a lens 7 forms an image from the manuscript 1 onto a photosensitive member 9 positioned on an exposure mount 8. An exhaust fan 10 captures heat generated by the light source and heat and gas produced around a heat developing device, and discharges them outside of the apparatus. A developing roller 23 is equipped inside with a heat source, such as a halogen lamp or a ceramic heater, and heat-develops the photosensitive member 9, onto which a latent image is formed. A paper feeding device 13 sends out a transfer member in the shape of a cut sheet which is accommodated in a paper feed tray 11. An upper roller 31, a middle roller 32, and a lower roller 33 put the heat-developed photosensitive member 9 and the transfer member 12 together under pressure, thus transferring an image from the photosensitive member 9 to the transfer member 12. The transfer member 12, which has been completely transferred under pressure, is then discharged by paper discharge rollers 51 into a paper discharge tray 52. The photosensitive member 9 is housed in a cassette 14. An unused portion of photosensitive member 9 is fed from a supply roll 15 while a used portion of photosensitive member is withdrawn around a wind-up roll 16.

The operation of various components will now be explained in the order of FIGS. 8 to 12.

Figure 8:
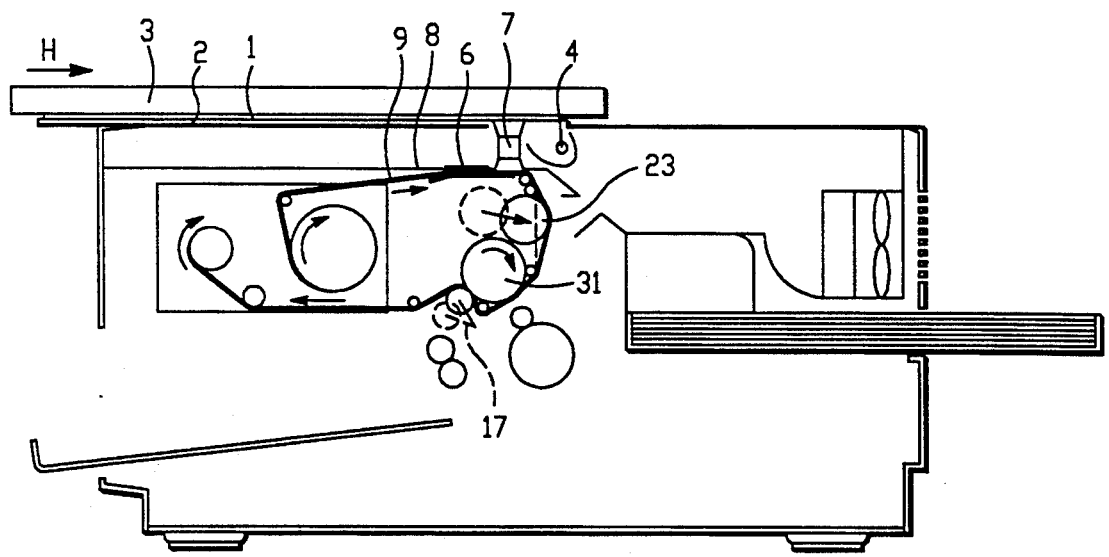
FIG. 8 is a cross-sectional view showing the states of various components when the operation of the second embodiment begins.

First, once a copy operation begins, as shown in FIG. 8, the manuscript mount 2 onto which the manuscript 1 is placed and the manuscript cover 3 move to an exposure start position on the left-hand side of the figure. Scanning begins in a direction indicated by arrow H. At the same time, the developing roller 23 moves in a direction indicated by arrow I, becoming ready for development. Then the upper roller 31 rotates, and a pinch roller 17 is pressed against it, so that the photosensitive member 9 is carried synchronously with the scanning of the manuscript. At this point, the light source is lit followed by the release of the shutter 6, and then the latent image of the manuscript 1 is formed through the lens 7 onto the photosensitive member on the exposure mount 8.

Figure 9:
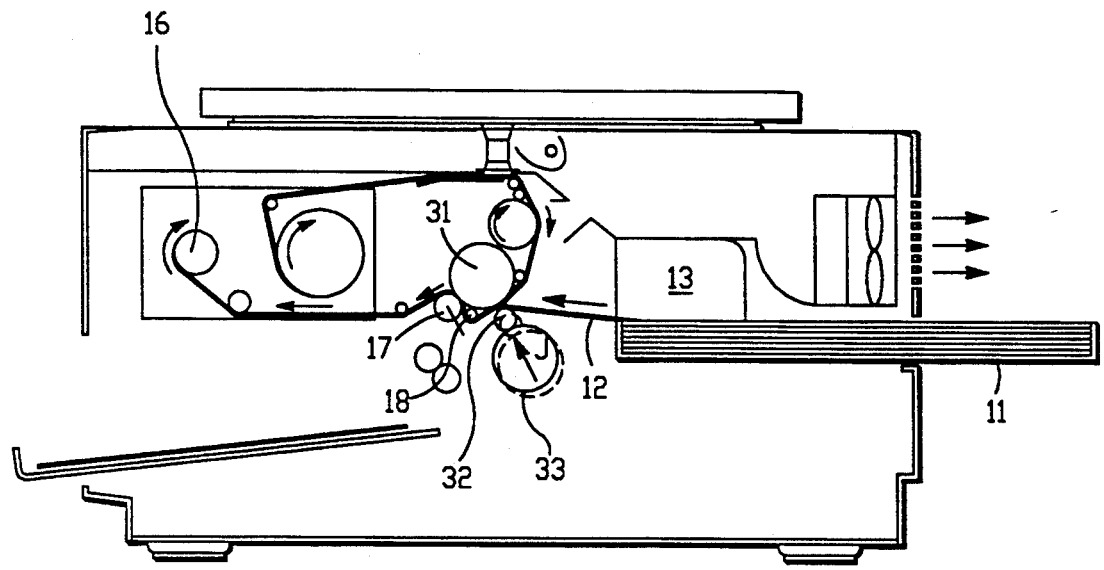
FIG. 9 is a cross-sectional view showing the states of the various components when pressure transfer is performed in the second embodiment.

Next, as seen in FIG. 9, when the front edge of the heat-developed image approaches the upper roller 31, the transfer member 12 is supplied by the paper feeding device 13 from the paper feed tray 11, and is superposed by an image zone on the photosensitive member. The middle roller 32 and the lower roller 33 move in a direction indicated by arrow J. The image and image zone are pressed by and between, the upper, middle, and lower rollers. The pressure transfers the image from the photosensitive member 9 onto the transfer member 12. After the transfer, the photosensitive member 9 is separated by a separation roller 18 from the transfer member 12, which is withdrawn onto the wind-up roll 16 in the cassette 14 via the pinch roller 17.

Figure 10:
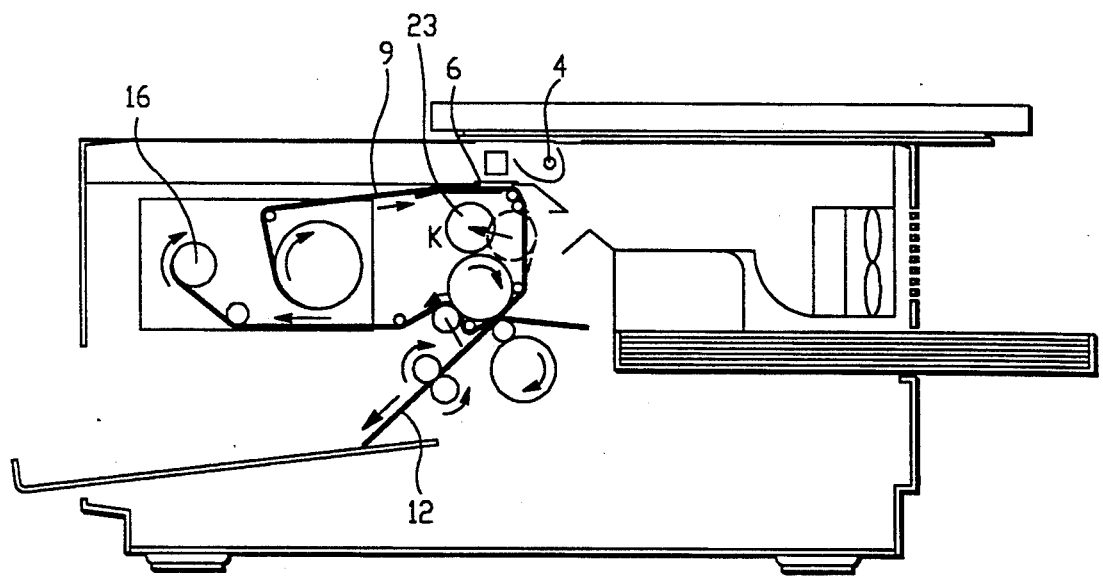
FIG. 10 is a cross-sectional view showing the states of the various components when exposure is completed in the second embodiment.

Then, as seen in FIG. 10, after exposure scanning has been completed, the light source 4 goes off and the shutter 6 closes. After the back edge of the image has been heat-developed, the developing roller 23 moves in a direction indicated by arrows K so as to not develop any unused photosensitive member, which may be carried or transferred before the back edge of the image is completely transferred under pressure.

Figure 11:
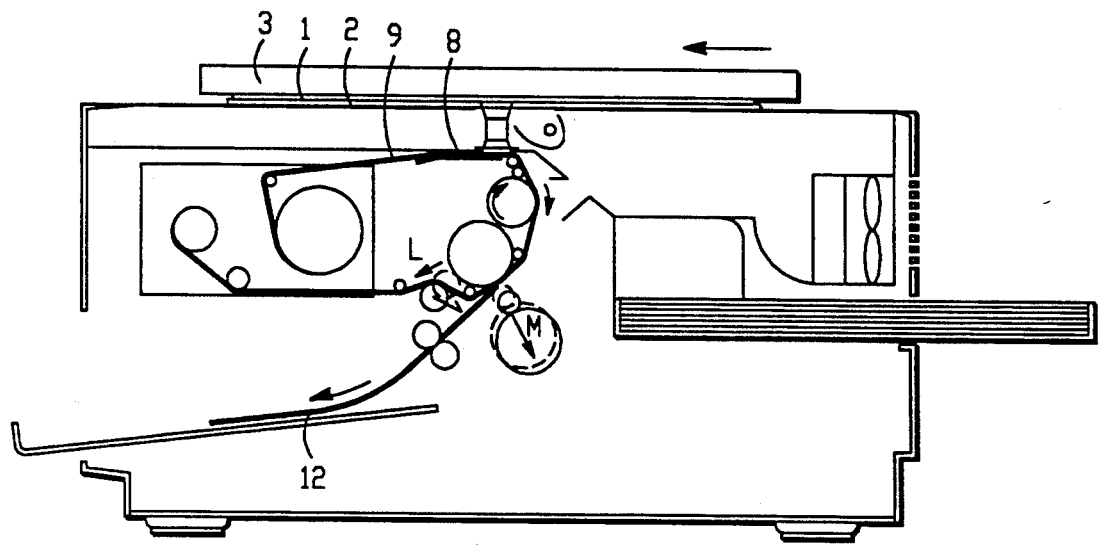
FIG. 11 is a cross-sectional view showing the states of the various components when pressure transfer is completed in the second embodiment.
Figure 12:
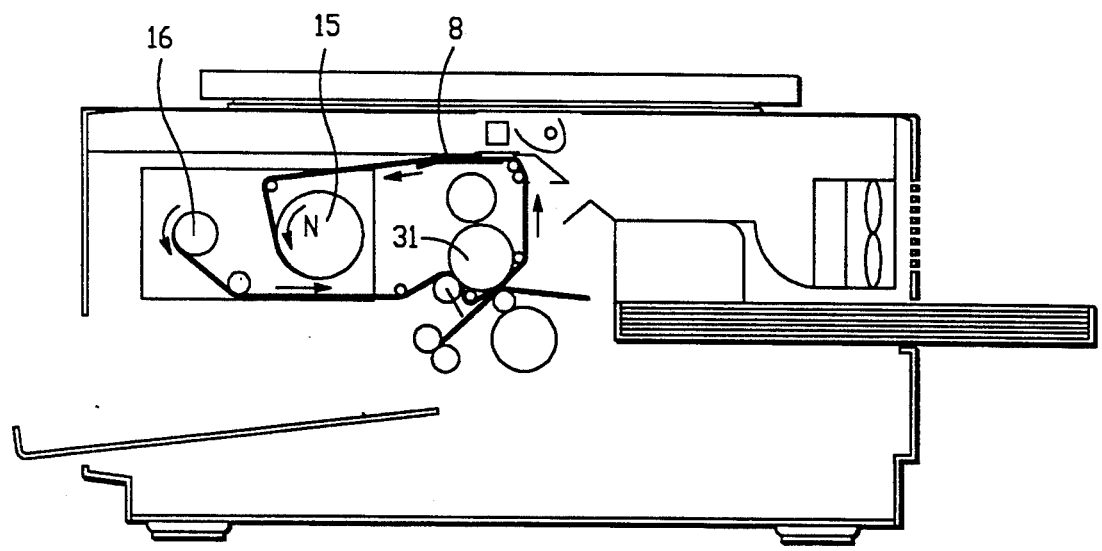
FIG. 12 is a cross-sectional view showing the states of the various components when rewinding is carried out in the second embodiment.

Furthermore, as illustrated in FIG. 11, after the back edge of the image has been completely transferred under pressure, the middle roller 32 and the lower roller 33 move in a direction indicated by arrow L, whereas the pinch roller 17 moves in a direction indicated by arrow M. Then, the transfer of the photosensitive member 9 stops. The transfer member 12, which has been completely transferred under pressure, is discharged outside of the apparatus while it is being heat-fixed. The manuscript mount 2, onto which the manuscript 1 is placed, and the manuscript cover 3 return to the center of the apparatus. At this time, the unused photosensitive member is withdrawn between the exposure mount 8 and the upper roller 31. As shown in FIG. 12, the supply roll 15 operates in a direction indicated by arrow N, thereby rewinding the end of the unused photosensitive member until it returns to the exposure mount 8. After a series of operations have finished, the apparatus returns to the state shown in FIG. 7, completing the whole image formation operation.

Figure 13:
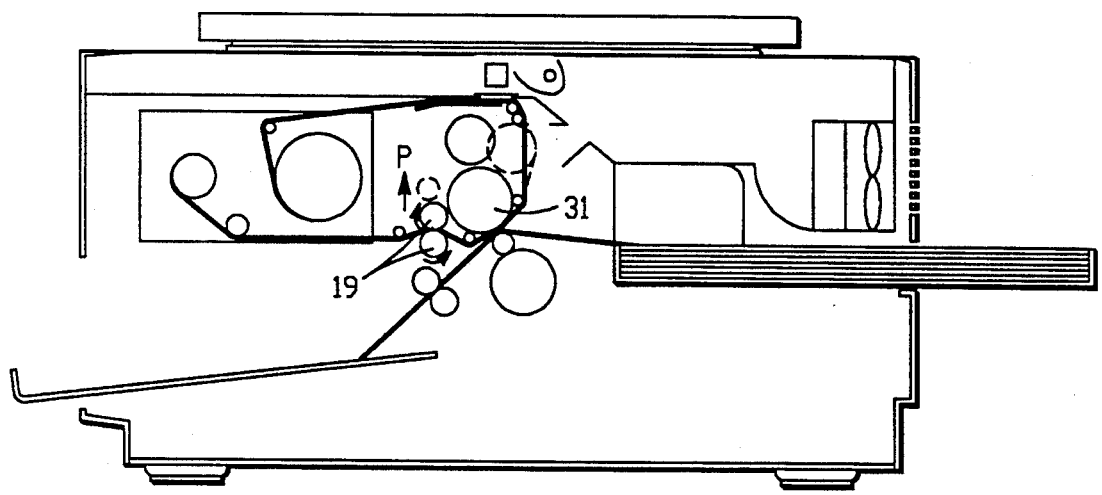
FIG. 13 is a cross-sectional view showing other various components of the second embodiment.

In the first and second embodiments, because the used and unused photosensitive members are accommodated in the same attachable/detachable cassette, it is possible to reduce the time for disposing of and replacing the photosensitive member, thus improving handling. The upper roller 31 is pressed against the pinch roller 17, whereby the photosensitive member is carried when the image is formed. As shown in FIG. 13, however, photosensitive member carrying rollers 19 may also be provided to be actuated after pressure transfer has been performed. With the structure of FIG. 13, when the photosensitive member is rewound, it is necessary either to release one of the photosensitive member carrying rollers 19 in a direction indicated by arrow P, or to provide a clutch or the like in driving system, not shown, operating the photosensitive member carrying rollers 19.

As has been described above, in the first and second embodiments, although the heat developing device moves so as not to develop the unused photosensitive member, instead of moving the heat developing device, it is possible to intercept heat to prevent the unused photosensitive member from being developed.

Figure 14:
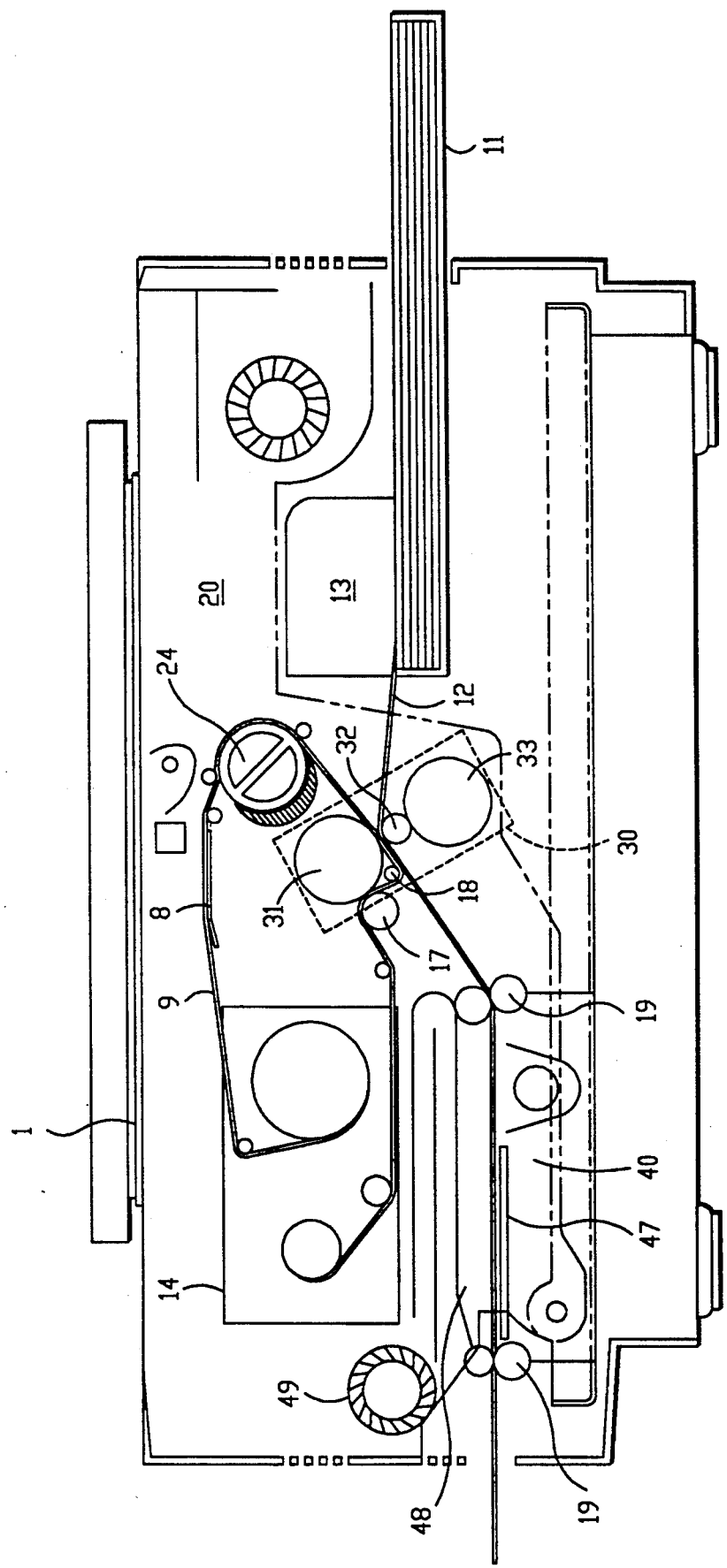
FIG. 14 is a cross-sectional view showing a third embodiment of this invention.

FIG. 14 is a front cross-sectional view of a copying machine showing a third embodiment of this invention. A latent image, into which an image on a manuscript 1 is turned, is formed on an unused photosensitive member 9 disposed on an exposure mount 8. The photosensitive member 9 is discharged from a cassette 14, a photosensitive container for the continuous photosensitive member. The latent image is then heat-developed by a heat developing device 20 having a heat cylinder 24. A transfer member 12, on the other hand, is provided by a paper feeding device 13 from a paper feed tray 11, and is superposed by the photosensitive member 9 synchronously with an image zone on the photosensitive member 9. The transfer member 12 is then transferred under pressure through a pressure transfer device 30 of a roller pressure system. The pressure portion of the pressure transfer device 30 is composed of an upper roller 31, a middle roller 32 and a lower roller 33. The transfer member 12 is transferred under pressure by and between the upper and middle rollers 31 and 32. It then passes through a fixing device 40 having a heater unit 46, and is discharged outside the apparatus. After the photosensitive member 9 has been separated by a separation roller 18 from the transfer member 12, it is wound into the cassette 14 via a pinch roller 17, which quickens the transfer and separation of the photosensitive member 9.

In this embodiment, numeral 19 denotes photosensitive member carrying rollers for guiding the transfer member; a guide plate 47; an air guide 48 for preventing heat transmission between the fixing device 40 and the cassette 14; and a fan 49 for causing an air stream inside the air guide 48. The pressure transfer device 30 is constructed in such a manner that, when the transfer member 12 is inserted into it, pressure is applied to it, whereas when the transfer member 12 is discharged, pressure is released. A heat developing device 20 featuring this embodiment will now be explained in more detail.

Figure 15:
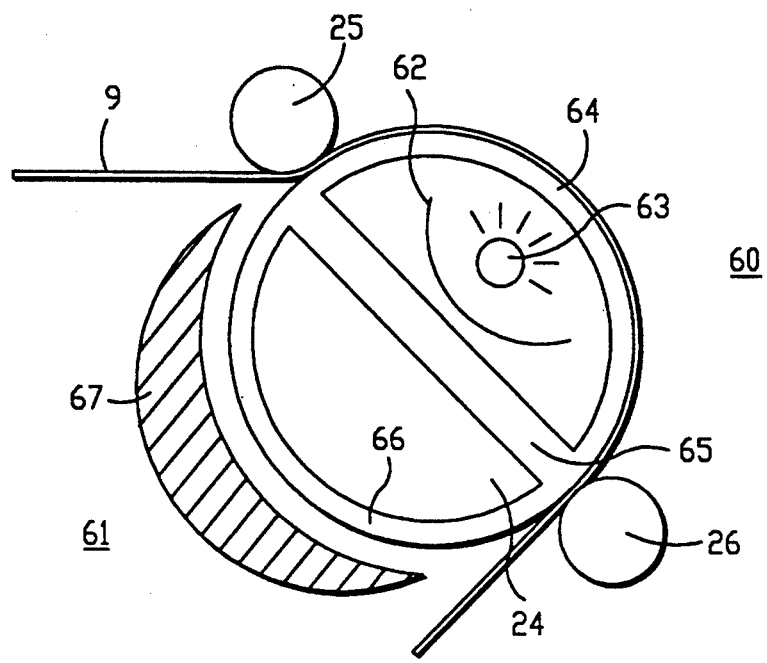
FIG. 15 is a front cross-sectional view of a heat developing device.

FIG. 15, corresponding to FIG. 14, is a front cross-sectional view showing the main mechanism of the heat developing device 20 according to one embodiment.

In the drawing of FIG. 15, the photosensitive member 9 is wound around the heat cylinder 24 while carrying rollers 25 and 26 hold it in position. The photosensitive member 9 is under tension and while in motion, is heated through contact with the cylinder. The heat cylinder 24 itself is stationary and roughly divided in half: into a heated portion 60 in contact with the photosensitive member 9 and an unheated portion 61 not in contact the member 9. The heated portion 60 which is in contact with the photosensitive member 9 has a halogen lamp heater 63 inside with a reflector 62. The halogen lamp heater 63 is appropriately turned ON and OFF so that a surface 64 of the cylinder is maintained at a substantially constant temperature. The surface 64 of the cylinder is made of a material having high heat conductivity. The unheated portion 61, into which air cooled by a cooling fan always flows, is made hollow. A shielding plate 65, for separating the heated portion 60 from unheated portion 61, and a surface 66 of the unheated cylinder portion 61, are made of materials having low heat conductivity or materials which are thermally insulative. In this embodiment, the heated portion 60 is disposed above to improve heat conductivity.

An arc-like thermal shield member 67, constituting the main feature of a thermal shield mechanism, is disposed near the unheated portion G1 of the heat cylinder 24, and is constructed so that it is capable of rotating around the periphery of the heat cylinder 24. The thermal shield member 67 is connected to an operating system, not shown, which is controlled to rotate or stop in the same direction as the direction in which the photosensitive member 9 is being carried.

Figure 16:
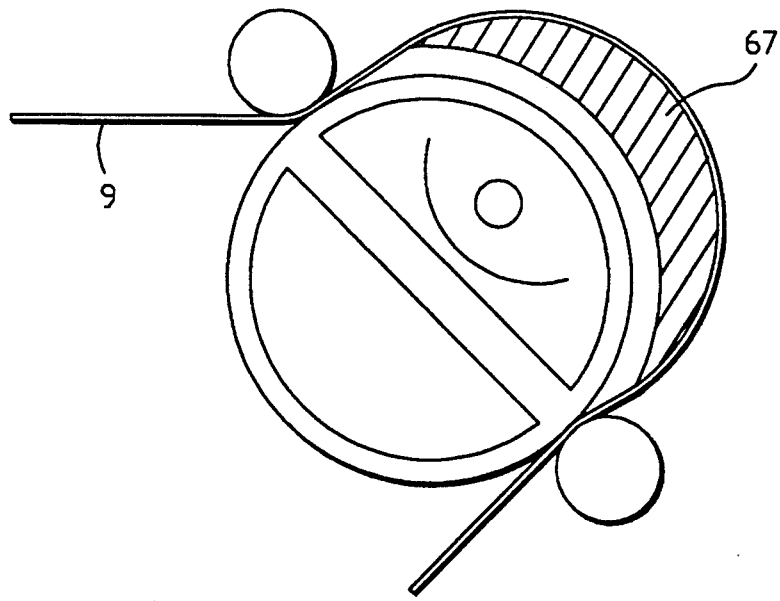
FIG. 16 is a front cross-sectional view showing the operation of a thermal shield member.

In the heat developing device 20 constructed as shown in FIG. 15, when the photosensitive member 9 with the image exposed is carried, the cooled thermal shield member 67 stands ready under the unheated portion 61. The halogen lamp heater 63 heats the photosensitive member 63. When the unexposed portion of the photosensitive member 9 approaches the heated portion 60, the well-cooled thermal shield member 67 begins to move around the heat cylinder 24 synchronously with the movement of the photosensitive member 9, and continues to move until it covers the heated portion 60 of the heat cylinder 24 (FIG. 16). Such a configuration is maintained until the unexposed portion of the photosensitive member 9 moves away from the heated portion 60. When the unexposed portion moves away from the heated portion 60 as by re-winding the photosensitive member 9, the thermal shield member 67 moves again returning to the standby position mentioned above.

If the halogen lamp heater 63 is turned OFF, preferably when the thermal shield member 67 moves to cover the heated portion 60 of the heat cylinder 24, heat is considerably intercepted. Also, if a cooling means (for example, a cooling element utilizing the Peltier effect) is provided to the thermal shield member 67, heat is more effectively intercepted.

Moreover, in this embodiment, heat development is carried out while the photosensitive member 9 is in motion. However, for example, when the back edge of the exposed portion comes to the heated portion 60, photosensitive member 9 movement is stopped to complete the heat development. The heater is then turned OFF, and the photosensitive member 9 is moved synchronously with the transfer of the thermal shield member 67, whereby heat is intercepted more effectively.

A method employing a non-contact thermal shield means may also be effective when the photosensitive member 9 in contact is heated as in this embodiment. In such a case, the heated portion 60 may be moved away from the photosensitive member 9; or the photosensitive member 9 may be moved away from the heated portion 60; or both members may be moved from each other.

The method of intercepting heat by the above thermal shield mechanism is applicable to other heating systems as well. Applications will be briefly explained in which radiation heating (FIG. 17), warm air heating (FIG. 18), or electrical charge heating (no drawing) are applied.

Figure 17:
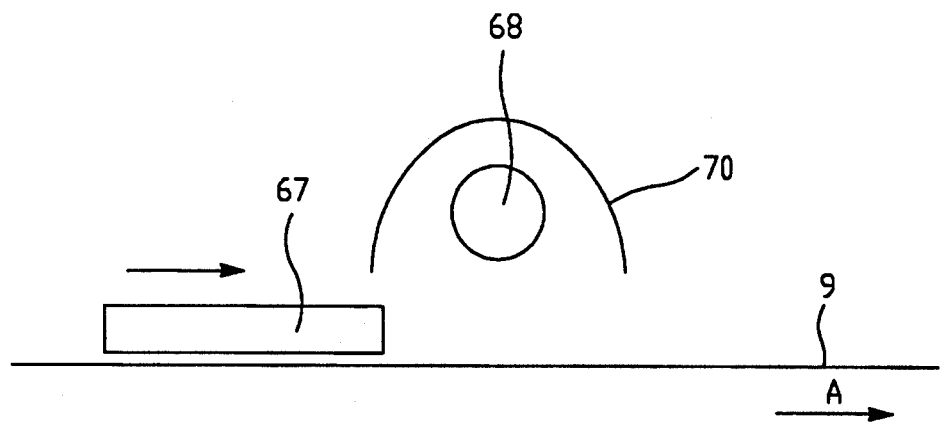
FIG. 17 is a schematic cross-sectional view showing an embodiment of the heat developing device.

In FIG. 17, radiative heat from a heater 68 with a reflector 70 heats the photosensitive member 9 moving in a direction indicated by arrow A. When the exposed portion passes the heater and the unexposed portion approaches there, the pre-cooled thermal shield member 67 moves synchronously with the photosensitive member 9 in the same direction. After the unexposed portion has passed the heater, the thermal shield member 67 returns to its original position, thus repeating the same procedure. In such a case, the heater 68 is exclusively used for heat development, and may utilize heat of other components (such as the heat fixing device and the light source) in the apparatus.

Figure 18:
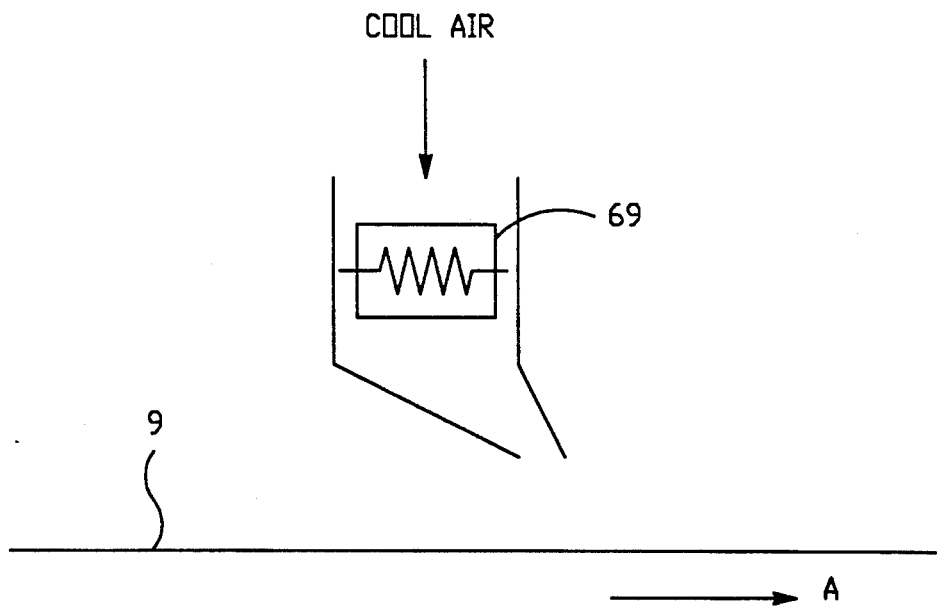
FIG. 18 is a schematic cross-sectional view showing another embodiment of the heat developing device.

In FIG. 18, a heating portion is constructed in such a way that cool air is blown through the back of a heater 69 to the photosensitive member 9 moving in a direction indicated by arrow A. In this instance, when the exposed portion approaches the heater, the latter is turned ON, whereas when the unexposed portion approaches, the heater is turned OFF. It is thus very easy to switch over to a heated state from a heat-intercepted state and vice versa.

When a heat-resistant layer is provided on the photosensitive member 9 for electrical charge heating, basically, the exposed portion is electrically charged while the unexposed portion is not electrically charged to intercept heat. However, heat may not be fully intercepted because of factors such as the heat-resistant layer having a continuous form. It is possible to employ various means as a countermeasure for this problem. For instance, electrical charge electrodes are provided in the direction in which the photosensitive member 9 is carried, and the electrical charge is controlled in response to the passage of the photosensitive member 9; an auxiliary cooling means such as for air-cooling is provided; or a coating mechanism is provided for applying the heat-resistant layer only onto the exposed portion of the photosensitive member 9.

Any of the above heating systems may be employed alone or together with any other heating system. When one system is combined with another (e.g., the contact and warm air heating systems), though the mechanism becomes complex, heat is greatly applied or intercepted.

Embodiments of this invention have been described above in which an appropriate means controls the heat developing device to prevent the photosensitive member from being subjected to a heat phenomenon. It is also possible to avoid an unnecessary heat phenomenon by changing the path along which the photosensitive member is carried.

Figure 19:
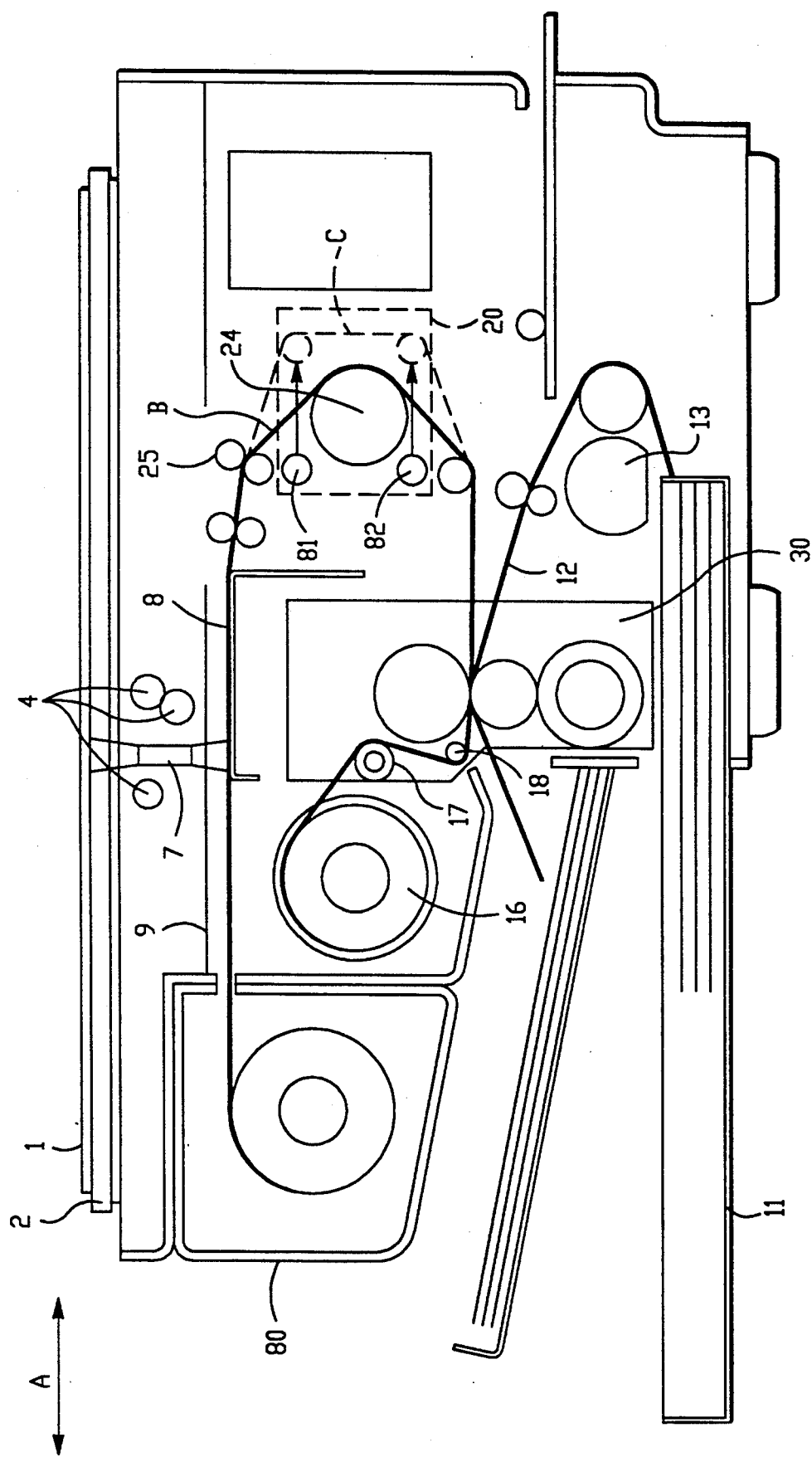
FIG. 19 is a front cross-sectional view showing another embodiment of this invention.

FIG. 19 is a front cross-sectional view of a copying machine in which an embodiment of this invention is mounted. The operation of this machine will now be described.

A manuscript 1 is placed on a manuscript mount 2 which is capable of moving in a direction indicated by arrow A. A light beam emanating from light source 4 irradiates the manuscript 1, and light reflected from the manuscript 1 passes through a lens 7 to form an image onto a photosensitive member 9 moving on an exposure mount 8, thus, forming a so called scan exposure system.

The photosensitive member 9 having a continuous sheet form, fed from a cartridge 80 for housing the photosensitive member before exposure, is exposed on the exposure mount 8 to form a latent image. Then, the latent image moves along a carrying path B, indicated by a solid line, after having passed through carrying rollers 25. The latent image is heat-developed by a heat cylinder 24 in a heat developing device 20. On the other hand, a transfer member 12 in the form of a cut sheet, accommodated in a paper feed tray 11, is fed by a paper feeding device 13. The transfer member 12 is superposed by the photosensitive member 9 synchronously with an image zone formed on the member 9, and is transferred under pressure by a pressure transfer device 30 of a roller pressure system. The transfer member 12 is separated by a separation roller 18 from the photosensitive member 9, and fed to a paper discharge tray 52. The photosensitive member 9 is wound around a wind-up roll 16 via a pinch roller 17, which quickens the transfer and separation of the photosensitive member 9.

A heat developing device and a method of carrying the photosensitive member, both featuring this embodiment, will now be explained.

The heat developing device featuring this embodiment uses a construction in which shaft-like or plate-like carry guides are used to change the path along which the photosensitive member is carried with respect to a heating element. Other features of the heat developing device also reside in a construction in which, when the carried photosensitive member requires heat development after exposure, it comes into contact with the heating element for heat development, and when the photosensitive member requires no heat development and is rewound or on standby, it is kept away from the heating element so as not to be heated. In reality, when on standby, carrying guide shafts 81 and 82 move in a direction indicated by the arrows, the carrying path of the photosensitive member changes to a carrying path C indicated by a dotted line. As a result, the photosensitive member becomes separated away from the heat cylinder and is not affected by the heat.

Figure 20:
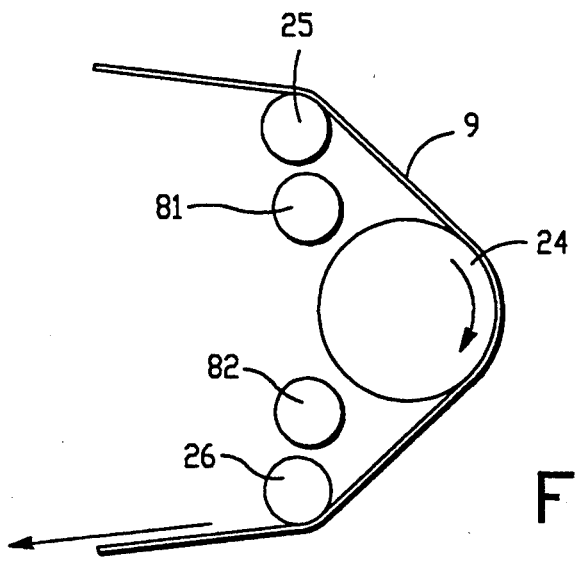
FIG. 20 is a view showing a first embodiment of the path along which a photosensitive member is carried during heat development.
Figure 21:
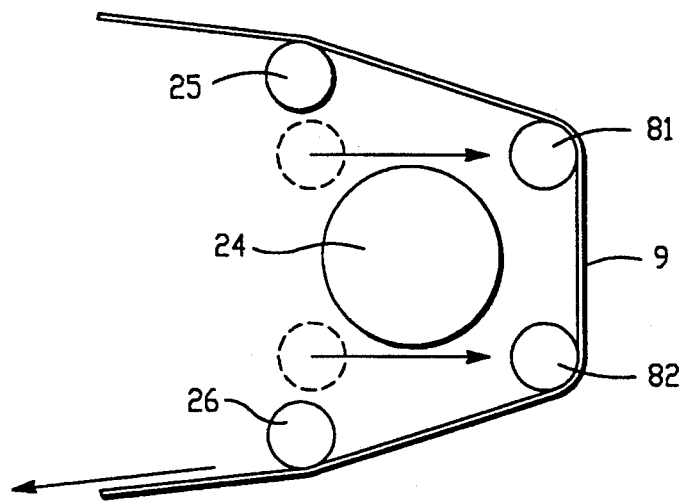
FIG. 21 is a view showing the embodiment of the path along which the photosensitive member is carried during non-heat development.

FIGS. 20 and 21 show views of the principle of operation for a first embodiment of a path along which the photosensitive member is carried when an exposed photosensitive member must be heatdeveloped. The carrying guide shafts 81 and 82 are positioned as shown in FIG. 20. Carrying rollers 25 and 26, and the heat cylinder 24 control the carrying path of the photosensitive member, whereby the photosensitive member 9 comes into contact with the heat cylinder 24, and is heated and developed. On the other hand, when the photosensitive member is not yet exposed and does not require heat development, the carrying guide shafts 81 and 82 are moved by a link mechanism, not shown, to positions shown in FIG. 21. The carrying path of the photosensitive member passes through a position away from the heat cylinder 24, so that the photosensitive member 9 does not become heated.

Figure 22:
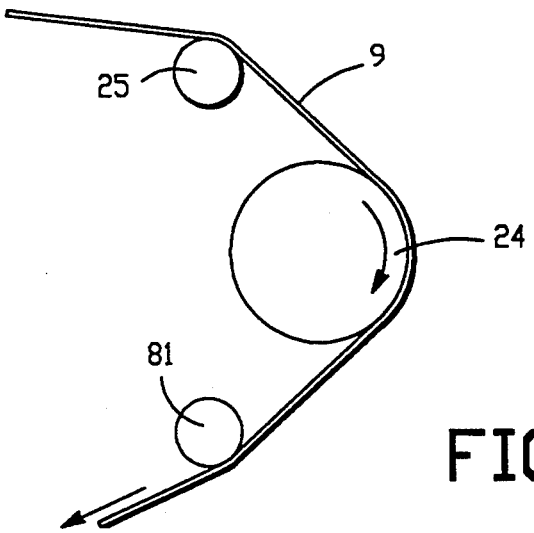
FIG. 22 is a view showing a second embodiment of the path along which the photosensitive member is carried during heat development.
Figure 23:
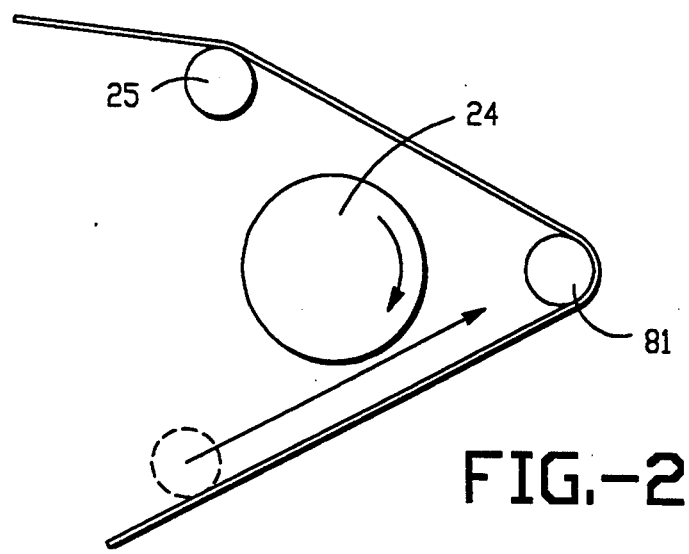
FIG. 23 is a view showing the second embodiment of the path along which the photosensitive member is carried during non-heat development.

FIGS. 22 and 23 show views of a second embodiment of the carrying path of the photosensitive member. During development, the carrying guide shaft 81 is positioned as shown in FIG. 22, and the photosensitive member 9 comes into contact with the heat cylinder 24, and is developed. During non-development, a heat member guide shaft 81 is moved by an unillustrated mechanism to a position shown in FIG. 23, thereby separating the photosensitive member 9 from the heat cylinder 24 so that the photosensitive member 9 is not developed.

Figure 24:
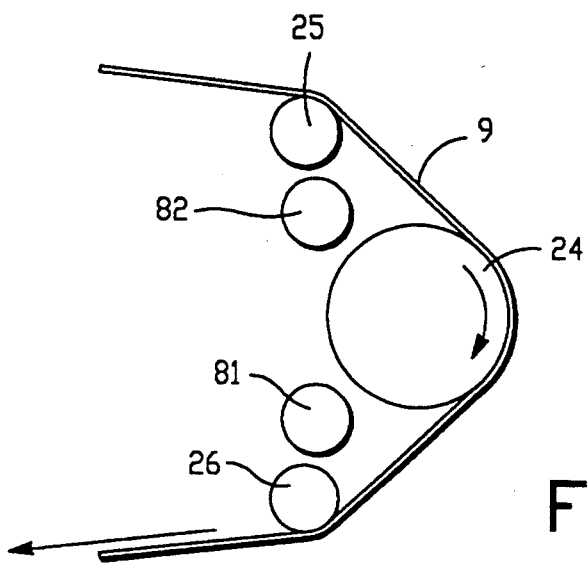
FIG. 24 is a view showing a third embodiment of the path along which the photosensitive member is carried during heat development.
Figure 25:
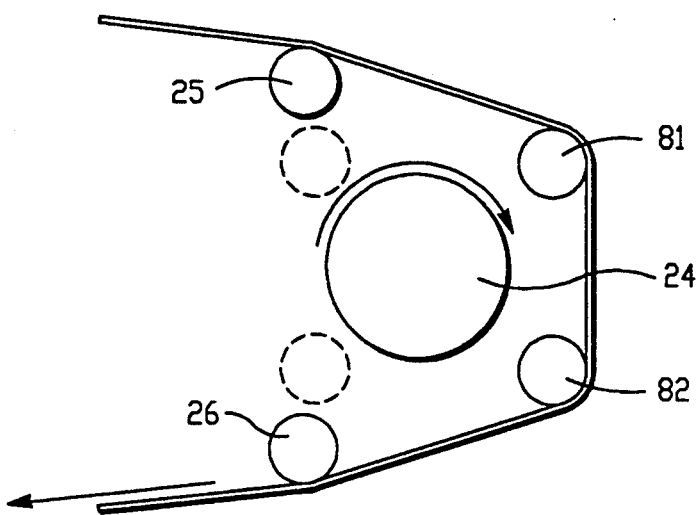
FIG. 25 is a view showing the third embodiment of the path along which the photosensitive member is carried during non-heat development.

FIGS. 24 and 25 show views of a third embodiment of the carrying path of the photosensitive member. The carrying guide shafts 81 and 82 are attached to a plate, not shown, which is rotatable around the shaft of the heat cylinder 24. During development, the carrying guide shafts 81 and 82 are positioned as shown in FIG. 24, and the photosensitive member 9 comes into contact with the heat cylinder 24, and is developed. During non-development, the rotation of the plate causes the carrying guide shafts 81 and 82 to move to the positions shown in FIG. 25, thus, separating the photosensitive member 9 from the heat cylinder 24 so that the photosensitive member 9 is not developed.

Figure 26:
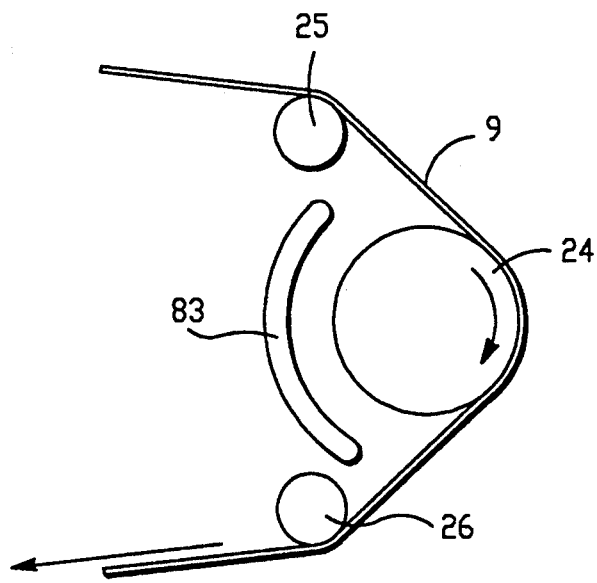
FIG. 26 is a view showing a fourth embodiment of the path along which the photosensitive member is carried during heat development.
Figure 27:
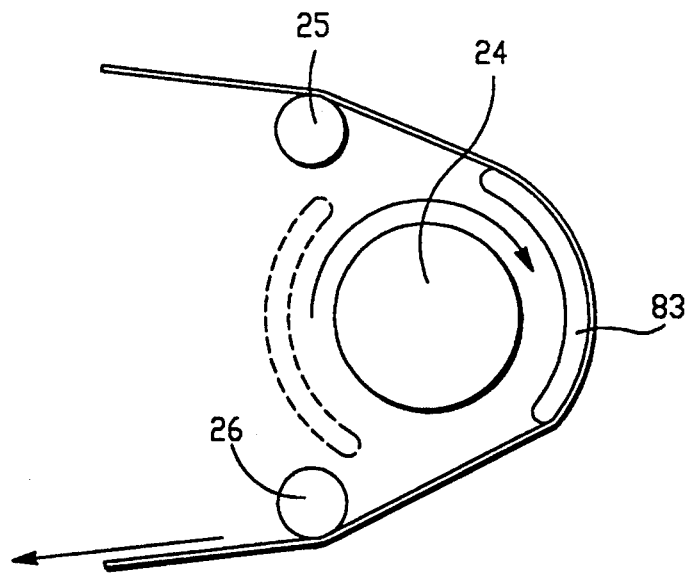
FIG. 27 is a view showing the fourth embodiment of the path along which the photosensitive member is carried during non-heat development.

FIGS. 26 and 27 show views of a fourth embodiment of the carrying path of the photosensitive member. During development, a carry guide plate 83 is positioned as shown in FIG. 26, and the photosensitive member 9 comes into contact with heat cylinder 24, and is developed. During non-development, the carry guide plate 83 is positioned as shown in FIG. 27, thus, separating the photosensitive member 9 from the heat cylinder 24 so that the photosensitive member 9 is not developed.

Figure 28:
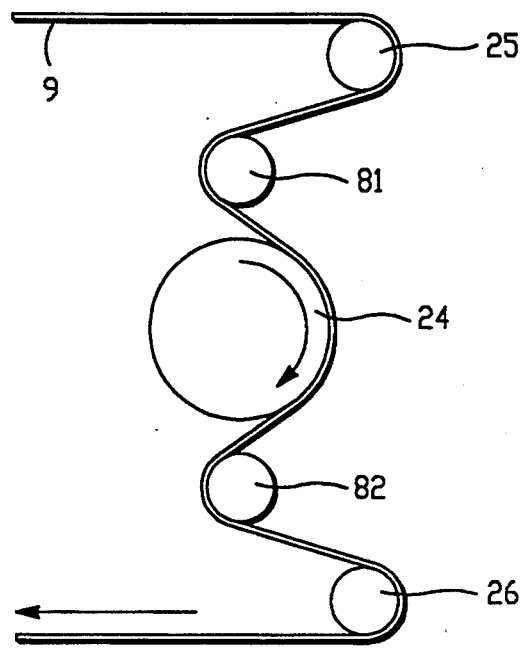
FIG. 28 is a view showing a fifth embodiment of the path along which the photosensitive member is carried during heat development.
Figure 29:
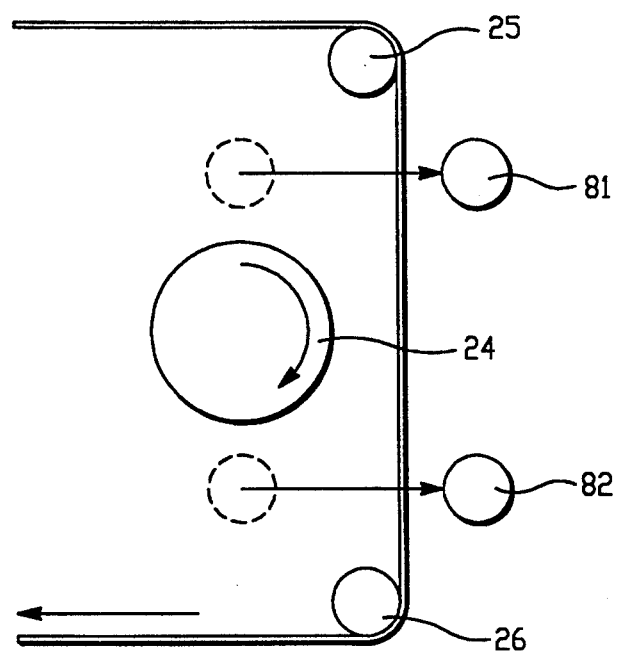
FIG. 29 illustrates a second view of the carrying path of FIG. 28 during non-development when guide shafts are repositioned.

FIGS. 28 and 29 show views of a fifth embodiment of the carrying path of the photosensitive member. During development, the carrying guide shafts 81 and 82 are positioned as shown in FIG. 28, and the photosensitive member 9 comes into contact with the heat cylinder 24, and is developed. During non-development, the carrying guide shafts 81 and 82 are positioned as shown in FIG. 29, thus, separating the photosensitive member 9 from the heat cylinder 24 so that the photosensitive member 9 is not developed.

In the heat developing device of these embodiments, although a heat cylinder is used as the heating element, the invention is not limited to such a heat cylinder. A plate-type heater may also be employed so long as the heating element is of a contact type.

The present invention has been described for use in a copying machine as an example, however, it is needless to say that it is applicable to image formation apparatus in general, such as printers, facsimile equipment, and electronic cameras.

Because of the rapid increase in office automation in recent years, there is an increasing demand for printers and copying machines, particularly for outputing images in color. The present invention is very effective in obtaining high-quality color images at a low price. It is predicted that this invention will find more and more use in color copying machines and printers.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. An image formation apparatus, comprising:
   a continuous form photosensitive member positioned to move along a predefined transfer path;
   exposure means disposed along said transfer path for exposing an image onto a portion of said photosensitive member;
   heat developing means disposed along said transfer path for heating said exposed image portion and for intercepting heat to an unexposed portion of said photosensitive member;
   pressure transfer means for superposing, under pressure, said exposed image portion of said photosensitive member and an image transfer member; and
   one or more cylindrical path guides disposed in said photosensitive member transfer path in contact therewith, and being movable transverse to said path between at least a first position guiding said photosensitive member into contact with said heating means and a second position preventing photosensitive member contact with said heating means.

2. The image formation apparatus of claim 1 wherein said cylindrical path guides comprise two guide posts which move in a linear direction to lift said photosensitive member away from said heating means when unexposed portions are present.

3. The image formation apparatus of claim 1 wherein said cylindrical path guides comprise two guide posts mounted on a support plate which rotates about a central axis so as to reposition said guides relative to said heating means and thereby move said photosensitive member away from said heating means when unexposed portions are present.

4. The image formation apparatus of claim 1 wherein said cylindrical path guides comprise a guide roller mounted on a support plate which moves said roller away from proximity to said heating means when unexposed photosensitive member portions are present.

5. The image formation apparatus of claim 1 wherein said cylindrical path guides comprise two guide rollers which move in a linear direction to lift said photosensitive member away from said heating means when unexposed portions are present.

6. The image formation apparatus of claim 1 wherein said cylindrical path guides comprise two guide rollers mounted on a support plate which rotates about a central axis so as to reposition said guides relative to said heating means and thereby move said photosensitive member away from said heating means when unexposed portions are present.

7. An image formation apparatus, comprising:
   a continuous form photosensitive member positioned to move along a predefined transfer path;
   exposure means disposed along said transfer path for exposing an image onto a portion of said photosensitive member;
   heat developing means disposed along said transfer path for heating said exposed image portion and for intercepting heat to an unexposed portion of said photosensitive member, said heat developing means comprising
   a cylindrical housing having (1) a heated portion arranged along a longitudinal axis of said cylindrical housing and having a heating element in surface contact with and for heating exposed portions of said photosensitive member, the longitudinal axis being positioned transverse to said transfer path and (2) an unheated portion arranged along the longitudinal axis of said cylindrical housing and separated from said heated portion by a thermally insulative material, and
   a thermal shield selectively movable along said transfer path in synchronization with and in the direction of transfer of said photosensitive member between at least one heat shielding position and one non-heat shielding position for protecting and preserving unexposed portions of said photosensitive member, said thermal shield comprising a curved heat shield positioned adjacent to said heating element and being movable concentric about said longitudinal axis between the heat shielding position between said heating element and said photosensitive member and the non-heat shielding position; and
   pressure transfer means for superposing, under pressure, said exposed image portion of said photosensitive member and an image transfer member.

8. The image formation apparatus of claim 7 further comprising cartridge means coupled to said transfer path for storing and dispensing unused photosensitive member along said transfer path, and for collecting used portions of said photosensitive member.

9. The image formation apparatus of claim 8, wherein said cartridge means comprises an attachable/detachable photosensitive member support container.

10. The apparatus of claim 8 wherein said cartridge means comprises at least a supply roller holding unused photosensitive member and a take-up roller connected to receive used photosensitive member.

11. The apparatus of claim 10 wherein said rollers are configured to move said photosensitive member in a first preselected direction along said transfer path for exposing an image on a portion thereof, and in a second direction for retrieving and storing unexposed portions of said photosensitive member after each image development.

12. The apparatus of claim 7 further comprising path alteration means for changing the path along which said photosensitive member is carried adjacent said heating means.

13. An image formation apparatus comprising:
   exposure devices for exposing a photosensitive member having, on a supporting body, a microcapsule in which at least a photosensitive substance and a coloring material are sealed;
   a heat developing device for heating exposed image portions of said photosensitive member, said heat developing device comprising
   a cylindrical housing having (1) a heated portion arranged along a longitudinal axis of said cylindrical housing and having a heating element in surface contact with and for heating exposed portions of said photosensitive member, the longitudinal axis being positioned transverse to said transfer path and (2) an unheated portion arranged along the longitudinal axis of said cylindrical housing and separated from said heated portion by a thermally insulative material, and
   thermal shielding selectively movable in synchronization with said photosensitive member, between at least one heat shielding position and one non-heat shielding position for protecting and preserving unexposed portions of said photosensitive member, said thermal shield comprising a curved heat shield positioned adjacent to said heating element and being movable concentric about said longitudinal axis between the heat shielding position between said heating element and said photosensitive member and the non-heat shielding position;

a pressure transfer device for superposing under pressure said photosensitive member and a transfer member; and a carrying device for carrying said photosensitive member, so that (1) said heat developing device is selectively switchable from a heated state to a non-heated state and the non-heated state to the heated state, (2) said pressure transfer device is selectively switchable from a pressurized state to a non-pressurized state and a non-pressured state to a pressured state, and (3) the direction in which said photosensitive member is carried by said carrying device is changeable.

14. The image formation apparatus of claim 13, wherein said photosensitive member has a continuous form, and said photosensitive member before being exposed and after being transferred under pressure is accommodated in a single attachable/detachable container.

15. A method of forming an image with an image formation apparatus, comprising the steps of:

moving a photosensitive member along a predefined transfer path;

exposing predefined portions of said photosensitive member to an image;

providing a heat developer having a cylindrical housing having (1) a heated portion arranged along a longitudinal axis of said cylindrical housing and having a heating element in surface contact with and for heating exposed portions of said photosensitive member, the longitudinal axis being positioned transverse to said transfer path and (2) an unheated portion arranged along the longitudinal axis of said cylindrical housing and separated from said heated portion by a thermally insulative material, and heat developing said exposed portions of said photosensitive member so as to form an image through application of heat by said heat developer to said portions;

carrying said photosensitive member in a positive feed direction while being heated during image development;

shielding unused portions of said photosensitive member from exposure to heat so as to preserve a usable photosensitive state; and carrying said photosensitive member in a reverse direction at completion of image formation.

16. The method of claim 15 wherein said step of heat developing comprises the steps of:

carrying said photosensitive member in contact with a heating element for heating exposed photosensitive member portions; and altering said transfer path so said photosensitive member is carried out of contact with said heating element, which remains in a substantially fixed location, when unexposed surface portions are present.

17. The method of claim 15 wherein said step of heat developing comprises the steps of:

carrying said photosensitive member in contact with a heating element for heating exposed photosensitive member portions;

providing a thermal shield member which is selectively movable along said transfer path between at least one heat shielding position between said photosensitive member and said heating element and one non-heat shielding position; and moving said thermal shield in synchronization with the transfer of said photosensitive member to protect said photosensitive member when unexposed surface portions are present, without moving said heating element and without displacing said photosensitive member from its transfer path farther than the dimensions of said thermal shield.

* * * * *

UNITED STATES PATENT AND TRADEMARK OFFICE
CERTIFICATE OF CORRECTION

PATENT NO. : 5,313,248
DATED : May 17, 1994
INVENTOR(S) : Yasuhiro Mita et al.

It is certified that error appears in the above-identified patent and that said Letters Patent is hereby corrected as shown below:

On the cover page of the Patent, item [86], § 371 Date reads as "Mar 11, 1991"; Date should be --Mar. 11, 1992--; and § 102(e) Date reads as --"Mar. 11, 1991"--; date should be --Mar. 11, 1992--.

Signed and Sealed this

Tenth Day of January, 1995

Attest:

BRUCE LEHMAN

*Attesting Officer*                *Commissioner of Patents and Trademarks*